(12) United States Patent
Rosenow

(10) Patent No.: US 10,215,789 B2
(45) Date of Patent: Feb. 26, 2019

(54) DEVICE AND METHOD FOR MONITORING A HIGH-VOLTAGE CONTACTOR IN A VEHICLE

(71) Applicant: Lisa Draexlmaier GmbH, Vilsbiburg (DE)

(72) Inventor: Daniel Rosenow, Landshut (DE)

(73) Assignee: Lisa Draexlmaier GmbH, Vilsbiburg (DE)

( * ) Notice: Subject to any disclaimer, the term of this patent is extended or adjusted under 35 U.S.C. 154(b) by 0 days.

(21) Appl. No.: 15/494,856

(22) Filed: Apr. 24, 2017

(65) Prior Publication Data
US 2017/0307671 A1    Oct. 26, 2017

(30) Foreign Application Priority Data

Apr. 25, 2016    (DE) .......................... 10 2016 107 598

(51) Int. Cl.
G01R 31/00        (2006.01)
G01R 31/327       (2006.01)
B60L 3/00         (2019.01)

(52) U.S. Cl.
CPC .......... *G01R 31/007* (2013.01); *B60L 3/0023* (2013.01); *G01R 31/3278* (2013.01)

(58) Field of Classification Search
None
See application file for complete search history.

(56) References Cited

U.S. PATENT DOCUMENTS

2005/0270720 A1*  12/2005  Johnson, Jr. ....... G01R 31/3278
                                                        361/170
2007/0201170 A1*   8/2007  Hooper .................. H02H 5/105
                                                         361/42
(Continued)

FOREIGN PATENT DOCUMENTS

CN        1554954 A    12/2004
CN        1965243 A     5/2007
(Continued)

OTHER PUBLICATIONS

Daimler et al., Method for detecting the operability of an electric relay and device for performing said method, Jun. 5, 2008, Anschuetz Frank, WO 2008064694 A1.*
(Continued)

*Primary Examiner* — Melissa Koval
*Assistant Examiner* — Nasima Monsur
(74) *Attorney, Agent, or Firm* — Finnegan, Henderson, Farabow, Garrett & Dunner, LLP

(57) ABSTRACT

A device for monitoring a high-voltage contactor in a vehicle having a coil with an anchor, the coil is energized with a coil current or a coil voltage to switch the high-voltage contactor, and the high-voltage contactor is switched by a motion of the anchor, thus also changing the inductivity of the coil includes an interface for reading in a measurement value function for the generated coil voltage and/or for the generated coil current during the switching cycle of the high-voltage contactor; an analysis device for determining a motion information representing a travel distance of the anchor based on the measurement value function; and a comparison device for comparing the motion information with a threshold value information. A fault signal is generated when the motion information falls below the threshold information

15 Claims, 5 Drawing Sheets

(56) References Cited

U.S. PATENT DOCUMENTS

2008/0074215 A1* 3/2008 Zhou .................... H01H 1/0015
　　　　　　　　　　　　　　　　　　　　　335/132
2014/0002093 A1    1/2014 Elliott et al.

FOREIGN PATENT DOCUMENTS

| CN | 101201390 A | 6/2008 |
| DE | 102015224658 A1 | 6/2017 |
| WO | WO 2008/064694 A1 | 6/2008 |
| WO | WO 2013/189527 A1 | 12/2013 |

OTHER PUBLICATIONS

German Office Action dated Dec. 19, 2016, 10 pages.
Office Action in German Application No. DE 10 2016 107 598.1, dated Dec. 19, 2016.
Decision to Grant in German Application No. DE 10 2016 107 598.1, dated Jun. 6, 2017.

* cited by examiner

DEVICE AND METHOD FOR MONITORING A HIGH-VOLTAGE CONTACTOR IN A VEHICLE

This application claims the benefit of priority of German Patent Application No. 102016107598.1, filed on Apr. 25, 2016, which is incorporated herein by reference.

TECHNICAL FIELD

The disclosed embodiments relate to a device for monitoring a high-voltage contactor in a vehicle and to a method for monitoring a high-voltage contactor in a vehicle.

BACKGROUND

Hybrid vehicles, plug-in and purely electrical vehicles, fuel-cell vehicles, and battery charging systems generally use voltages above 60 V. Statutory requirements often mandate that, when the rechargeable storage systems on battery-powered vehicles can overheat due to over-current, said vehicles must be equipped with safety devices such as fuses, circuit breakers, or master contactors that reliably disconnect the energy storage from the high-voltage electrical circuit if over-current occurs, regardless of the current direction. Corresponding contactors are well-known in the art. Such a contactor consists of two electrical contacts closed and/or connected by a movable switching element. The movable switching element is, for instance, moved between an idle position and a switched position by means of a coil and an anchor guided in the coil. One problem with contactors are contacts that do not completely open. This can, for instance, result in a single pole stuck contactor. While in this case the two contacts are electrically interrupted, the movable anchor is nevertheless unable to travel back to its idle position because one side of the switching element is stuck to the contact.

The German patent 102015224658.2 filed by the registrant describes an electro-mechanical circuit breaker with two contact pairs, wherein one contact of each of the contact pairs is physically segregated on a contact bridge. The circuit breaker also features an anchor connected with the contact bridge and movable along a range of motion. A micro-switch is also arranged in the proximity of the anchor or the contact bridge. This micro-switch is spaced to the anchor and/or the contact bridge such that the micro-switch is actuated when the anchor and/or the contact bridge is lowered by the range of motion. A defect can be identified with the micro-switch additionally arranged in the circuit breaker. The micro-switch is only actuated when the anchor has moved by the arranged range of motion, thus causing the circuit breaker to switch fault-free.

WO 2008/064694 A1 describes a method for detecting the ability of an electrical relay to function, along with a device to execute the method.

A switching arrangement and a method for monitoring an electro-magnetic relay is known from WO 2013/189527 A1.

US 2014/0002093 A1 describes a method for a relay contact monitor and control.

DESCRIPTION

Embodiments consistent with the present disclosure may at least partially overcome the disadvantage known from the prior art and to detect stuck contactors, with the intent of making this information available to a control device for further actions.

The disclosed embodiments may include a device with the characteristics in claim 1, and by a method with the characteristics in claim 7. Other embodiments are described in the dependent claims and the description of the figures.

The device according to the disclosed embodiments for monitoring a high-voltage contactor in a vehicle encompasses an interface for reading in a measurement value function, an analysis device, and a comparison device. The monitored high-voltage contactor features a coil with an anchor. The anchor is coupled with a switching element that can be moved from an idle position into a switched position, and vice-versa, by the motion of the anchor. In the switched position, two contacts of the high-voltage contactor are connected electrically. The high-voltage contactor is switched by energizing the coil with a coil current or a coil voltage. As a result, the high-voltage contactor is switched by a motion of the anchor, thus also changing the inductivity of the coil.

The device may be suited for monitoring a high-voltage contactor. The high-voltage contactor generally has a working range from 60 V to 1000 V or up to 1500 V. Monitoring such high-voltage contactors in a vehicle is relevant for safety. The device may, in an embodiment, also monitor other contactors or relays, which are, for instance, also used in a low-voltage power supply.

The interface for reading in the measurement value function may be arranged to read in a measurement value function during a switching cycle of the high-voltage contactor. In one example, the measurement value function represents the generated coil voltage and/or the generated coil current. The analysis device may be arranged to analyze the measurement value function for the purpose of obtaining motion information. In one example, the motion information represents the travel distance of the anchor. The motion information may therefore, in a simple example, be understood to represent a motion value or a travel distance that can be determined based on a value. The motion information may also represent information of a motion over time. From a physical point of view, in one example, a changing inductivity of the coil is observed and analyzed, said changing inductivity caused by the motion of the anchor. The changing inductivity is, in one example, proportional to the motion of the anchor. The comparison device may be configured to compare the motion information with threshold information, wherein a fault signal is generated when the motion information falls below the threshold information. In a simple example, the threshold information represents a threshold and the motion information represents a motion value, so that two values can be compared directly. A simple determination can thus be made as to whether the anchor has traveled a pre-defined travel distance. The motion information represents a motion and/or a distance by which the anchor moves. In a further embodiment, the motion information may represent a motion over time. Single-sided stuck contactors may also be detected with the device according to the disclosed embodiments.

In an embodiment, the measurement value function represents a current function of a coil current of the high-voltage contactor over time. In other words, the coil current may be recorded and read in over time. The current may be monitored with ease. Monitoring the coil current has the advantage that the measurement value function can be used to detect a (single-sided or two-sided) stuck contactor, both during the closing cycle as well as the opening cycle. An occurring fault may therefore be detected very quickly.

In an alternative embodiment, the measurement value function represents a voltage function of a coil voltage of the high-voltage contactor over time. A voltage measurement may also be implemented with ease. A wide range of controllers have a voltage monitoring function as a standard feature. A voltage measurement may also be easily implemented metrologically and without changing the applied coil voltage. One embodiment may then rely on an already available signal for the measurement value function. A cost-effective implementation is therefore possible.

Another embodiment may monitor both the current as well as the voltage. The detection may be rendered more robust based on the redundant embodiment.

The analysis device may also be arranged to analyze a flank of the measurement value function to thus determine the motion information. It may be advantageous in this case to monitor the flank for the presence of a local maximum and a local minimum. A presence of a local maximum and a local minimum represents a signal collapse during the flank. The changing inductivity of the coil should make a temporary collapse of the coil current or the coil voltage detectable. A steadily rising or steadily falling flank (without collapse) can then indicate a fault.

A differential over the first time interval and a differential over the second time interval may be formed, allowing both differentials to be compared. An alternative test may, for instance, determine whether a differential over a certain time interval differs from a differential of the remaining flank function.

In an embodiment, the analysis device may determine the motion information as a function of the signal spacing between the local maximum and local minimum (signal collapse) in comparison to the full flank height. A signal collapse may then be determined and analyzed during the signal transition, that is to say, during the flank. The ratio of a signal collapse to the maximum signal change, that is to say, the flank height, may then be determined and analyzed. The threshold information for the monitored high-voltage contactor may reference a corresponding ratio. In an embodiment, the threshold information may be more than 5% of the flank height, that is to say, that the signal collapse may be at least 5% of the maximum signal change; the threshold information may in particular be more than 10% of the flank height; the threshold information may further be greater than 20% of the flank height.

In another embodiment, the motion information may be determined as a function of a time differential between the local maximum and the local minimum and the time span of the flank. In this example, the threshold information is based on the time differential between the local maximum and the local minimum, or is alternatively based on the ratio of the two named time differentials. The time differentials may also be referred to as a time interval.

In an embodiment, the threshold information may also be understood as a threshold value band. The threshold value band may correspond to an ideal measurement value function with a pre-defined tolerance range. In this case, the motion information may be compared with the threshold value band. The fault signal may then be generated when the measurement value function leaves the threshold value band. The tolerance range may be adjusted by the ideal measurement value function with the slope and/or over the time, thus permitting ranges with a larger tolerance to be combined with ranges with a lower tolerance. Such a threshold value band may isolate various faults. More signal elements may then be monitored, and a fault may be detected with greater reliability.

The disclosed embodiments may also be implemented with a method for monitoring a high-voltage contactor. In this case, the method encompasses at least reading in the measurement value function, determining motion information of the anchor from the measurement value function, and comparing the motion information with threshold information. In one example, the measurement value function represents the coil voltage or the coil current during the switching cycle of the high-voltage contactor. The method may further include issuing a fault signal when the comparison operation generates a negative result. The fault signal then represents the occurrence of a stuck contactor of the high-voltage contactor. In this case, a stuck contactor may be understood to mean a high-voltage contactor open on only one side.

The method may have additional steps. The method may include recording the coil current and at the same time or alternatively recording the coil voltage of the high-voltage contactor and making these available as a measurement value function. The measurement value function in this example encompasses a plurality of measurement values within a pre-defined measurement time interval during which the contactor switches. This is also highlighted in the following descriptions.

The aforementioned discussions concerning the device apply to the method accordingly, and vice-versa. The device may be arranged in one component or distributed in several components. The device may furthermore be integrated into an ASIC.

The disclosed embodiments may furthermore encompasses a computer software product that can be loaded directly into the memory of a digital computer, the software product encompassing software code elements suited to execute steps of the method described herein.

The aforementioned properties, features, and advantages of this disclosure, along with the manner and method by which these are achieved are more readily and clearly understood in conjunction with the following schematic description of exemplary embodiments, which are described in detail in conjunction with the drawings. For purposes of consistency, the elements that are equivalent or have the equivalent effect are labeled with the same identifier.

The following provides a detailed description of the embodiments according to the present disclosure based on the figures and at least one exemplary embodiment.

Figure 1:
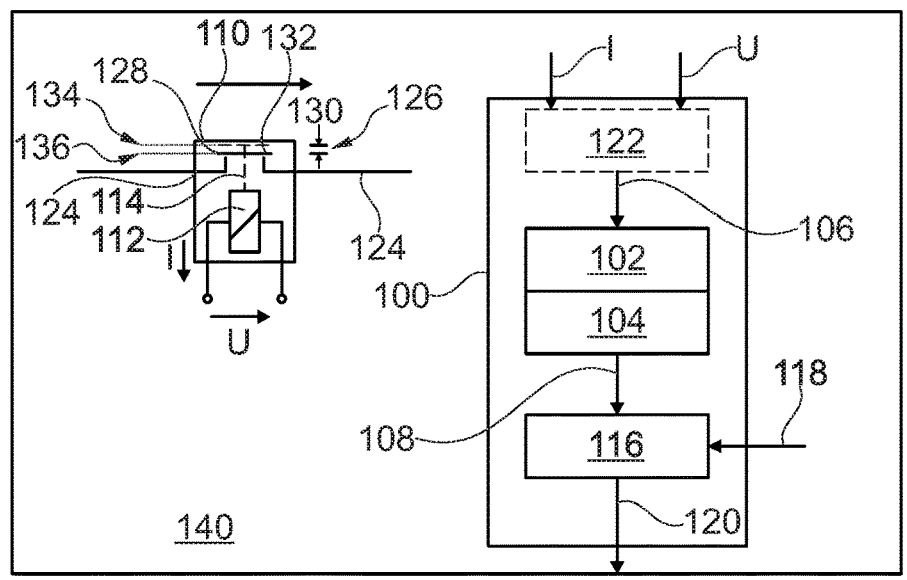
FIG. 1 shows a schematic representation of a device for monitoring a high-voltage contactor in a vehicle in accordance with an exemplary embodiment of the present disclosure.

FIG. 1 shows a schematic representation of an exemplary embodiment for a device 100 for monitoring a high-voltage contactor 110 in a vehicle 140. The vehicle 140 may be a hybrid vehicle 140, a plug-in and/or a purely electrical vehicle 140, or a fuel-cell vehicle 140. The (high-voltage) on-board power system 124 of the vehicle 140 has a voltage greater than 60 Volts direct current (VDC), in particular greater than 480 VDC. In an additional exemplary embodiment, the vehicle has an additional (not shown) low-voltage on-board power system with 12 VDC, 24 VDC or 48 VDC.

The high-voltage contactor 110 has a coil 112 and an anchor 114, wherein the anchor 114 is movably arranged in the coil 112. The anchor 114 is furthermore coupled with a switching element 132, which in a switched position 136 electrically connects a first contact 128 with a second contact 130. The contacts 128 and 130 are part of the high-voltage on-board power system 124 of the vehicle 140. When the high-voltage contactor 110 is closed, the high-voltage on-board power system 124 is therefore closed and under voltage. In this case, the anchor 114 and/or the switching element 132 coupled thereto is movable between the switched position 132 and an idle position 134. The anchor travels the travel distance 126 between the two positions 128, 130. The coil current I or the coil voltage U can be tapped on the connections of the coil 112.

The device 100 encompasses an interface for reading in a measurement value function 106, an analysis device 104, and a comparison device 116. The measurement value function 106 represents a signal of the coil current I or of the coil voltage U of the high-voltage contactor. In the shown embodiment, the device 100 also features an optional measurement device 122 arranged to record the coil current I and, at the same time or alternatively, to record the coil voltage U, and to make these available as a measurement value function 106. The measurement value function represents the coil current I and/or the coil voltage U over time. The individual measurement values will generally be polled equidistantly.

Interface 102 may be used to read the measurement value function 106 into the device 100. The analysis device 104 may be arranged to process the measurement value function 106 and to determine motion information 108. The motion information in this case represents the travel distance 126 covered by the anchor 114 over time. Depending on the embodiment, the analysis device 104 encompasses various functions for this purpose to qualitatively or quantitatively determine the motion information.

The comparison device 116 compares the motion information 108 with threshold information 118 and provides a fault signal 120 based on the results of the comparison. In other words, the threshold information 118 represents comparison information. For example, when motion information 108 is an individual motion value that represents the travel distance, threshold information 118 correspondingly represents an individual threshold value. As will be shown in other embodiments, motion information 108 may also represent a motion over time. In the latter case, threshold information 118 then also represents a signal over time.

As already indicated, depending on the embodiment, measurement value function 106 may represent a current function of the coil current I over time or alternatively may represent the coil voltage U over time when the high-voltage contactor 110 is either switched on or off. In one embodiment, both signals are monitored during both switching cycles, thus increasing the analysis certainty and allowing faults to be detected at an early stage. Corresponding stuck contactors may then be detected when they occur and not only during one of the following switching cycles.

Figure 3:
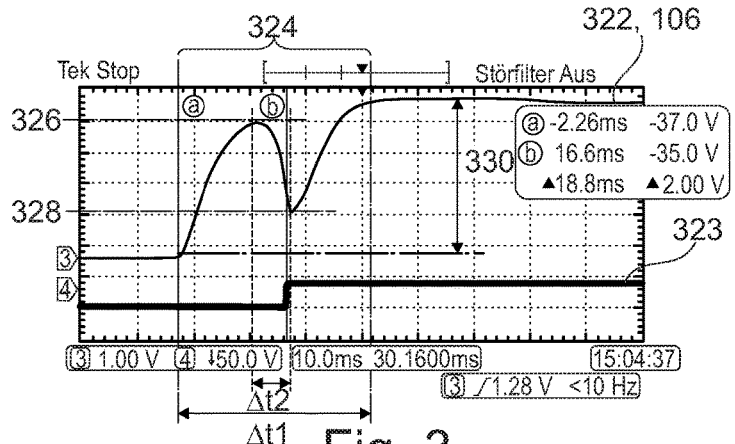
FIG. 3 through FIG. 4 show measurement value functions for the generated coil current (I) during the switching cycle of various high-voltage contactors.

In another embodiment, the analysis device 104 may be arranged to analyze the flank of measurement value function 106. This involves examining the flank for local maximums and local minimums. If no local maximum and no local minimum is found, this indicates a fault event. The identified local maximums and minimums are then analyzed further. The measurement value function in FIG. 3 shows a characteristic signal collapse in the flank, which differs according to the applied voltage and the employed high-voltage contactor.

In one embodiment, motion information 108 may be determined as a function of the signal spacing between the characteristic local maximum and the corresponding local minimum. Depending on the embodiment, this may be set in relation to the flank height or alternatively to the duration of the time interval of the flank. Threshold value information 118 may be defined in the corresponding embodiments in percentage of the flank height or the corresponding time interval, e.g. 5%, 10%, 15% or 20%. This may be done in direct dependence on the examined high-voltage contactor 110. In an alternative embodiment, pre-defined threshold values are monitored for the local maximum, and additionally or alternatively, for the local minimum. This may be easily and cost-effectively accomplished in a simple comparison in an ASIC or by a comparator circuit for an analog analysis.

In yet another embodiment, threshold value information 118 represents a threshold value band. The comparison device 116 in this embodiment may be arranged to compare motion information 108 with the threshold value band. Since the flank of measurement value function 106 already represents the motion of the anchor 114, measurement value function 106 may be compared with a threshold value band, and fault signal 120 may be generated when the examined signal 106 or 108 leaves the threshold value band.

Figure 2:
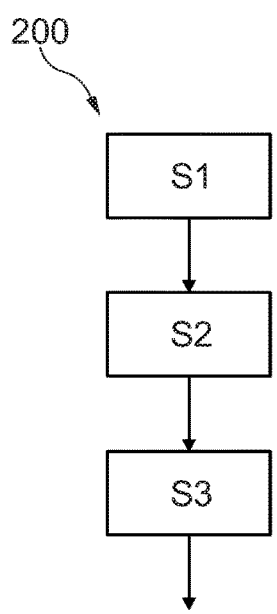
FIG. 2 shows a schematic representation of a method for monitoring a high-voltage contactor in a vehicle in accordance with an exemplary embodiment of the present disclosure.

FIG. 2 shows a method 200 for monitoring a high-voltage contactor in a vehicle in accordance with an embodiment of the present disclosure. The vehicle may be a version of a vehicle 140 shown in FIG. 1. Accordingly, the device 100 shown therein may be equipped with devices for executing the steps of the method 200 shown here.

The method 200 has step S1, reading in a measurement value function for the corresponding coil voltage (U) and/or the resulting coil current (I) during a switching cycle of the high-voltage contactor; step S2, determining a motion information representing a travel distance of the anchor based on the measurement value function; and step S3, comparing the motion information with a threshold value information, wherein a fault signal is generated when the motion information falls below the threshold value information.

In an optional embodiment, method 200 features an additional, not shown step, filtering or smoothing the measurement value function before the analysis for the purpose of concealing and/or filtering out small signal changes from the subsequent analysis.

FIG. 3 through FIG. 6 show measurement value functions 322 for the generated coil current (I) during the switching cycle of various high-voltage contactors. In this example, the measurement value functions 322 correspond to the measurement value functions labeled in FIG. 1 with the identifier 106. The signal 323 additionally shows the electrical state of the switching contacts of the high-voltage contactor. A Cartesian coordinate system represents the time on the abscissa and the voltage and/or current on the ordinate. The measurement value function 320 represents a voltage signal 320 or a function of the coil voltage over time, the measurement value function 322 represents a current signal 322 or a current function 322 of a coil current of the high-voltage contactor.

In the embodiment shown in FIG. 3, the identifier 324 identifies the signal segment of the voltage signal 320 designated as the flank 324. The flank 324 has a time duration of $\Delta t_1$. The flank 324 has a local maximum 326 and a local minimum 328. The flank height or the signal swing are labeled with the identifier 330. The time duration $\Delta t_2$ identifies the time interval or the duration between the occurrence of the local maximum 326 and the local minimum 328.

The change in the coil inductivity caused by the unidirectional motion of the anchor into and out of the coil results in a signal collapse within the (rising) flank 324 of the voltage signal 320. The duration $\Delta t_2$ in this exemplary embodiment is approximately 15%-20% of the time duration $\Delta t_1$ of the flank 324. The signal spacing between the local maximum 326 and the local minimum 328 in relation to the flank height 330 is at least 60% in the embodiment shown in FIG. 3.

Possible parameters for detecting a proper function are the start of the collapse, the duration of the collapse, and the current differential of the collapse. While these parameters of course vary depending on the employed contactor, they may nevertheless be defined for any contactor. The contactor state may be defined without the need for making modifications on the contactor (e.g. additional diagnostic contact).

Figure 4:
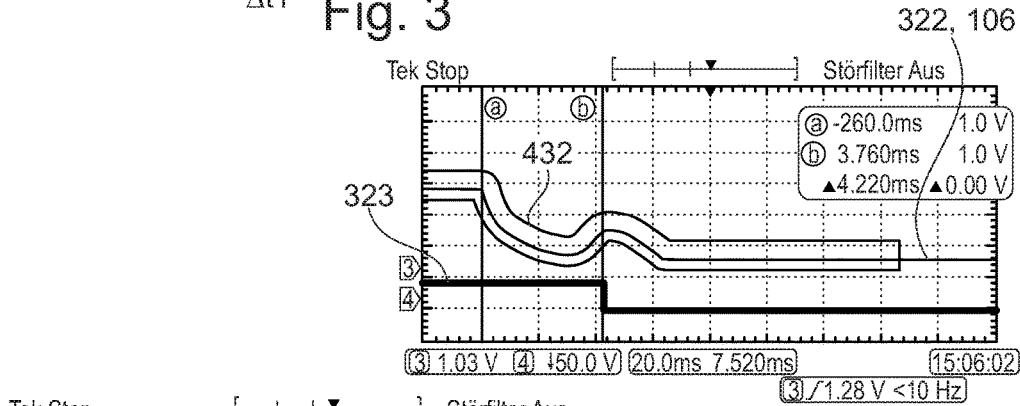

FIG. 3 shows the function of the coil current 322 during the switch-on cycle, and FIG. 4 shows the function of the coil current 322 during the switch-off cycle of the high-voltage contactor. FIG. 4 shows that the anchor motion energy during the opening phase causes the current to rise during the switch-off cycle.

In FIG. 4, the measurement value function 322 remains within a threshold value band 432. In this embodiment, the threshold value information may be represented as a threshold value band 432. The motion information may be represented by the measurement value function 322. It is then easy to examine whether the measurement value function 322 remains within the threshold value band 432. A fault signal is generated when the measurement value function 322 leaves the threshold value band.

In certain aspects, the threshold value band 432 corresponds to an ideal measurement value function 322 with a pre-defined tolerance range.

Figure 5:
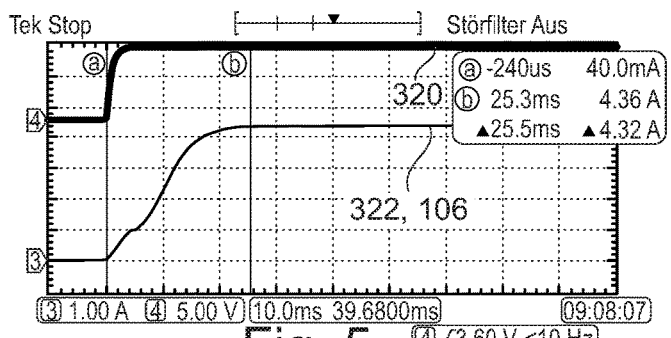
FIG. 5 through FIG. 6 show measurement value functions for the generated coil voltage (U) during the switching cycle of various high-voltage contactors.
Figure 6:
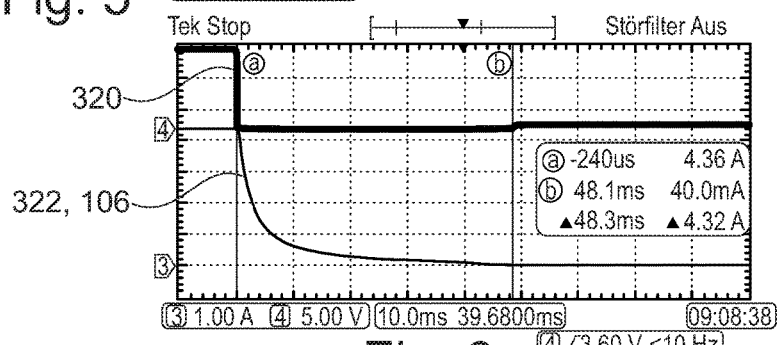

FIG. 5 shows a defective high-voltage EVC500 contactor during the switch-on cycle, and FIG. 6 shows the same defective EVC500 contactor during the switch-off cycle. The clearly evident collapse of the current function 322 during the flank 324 as shown in FIG. 3 and FIG. 4 does not occur.

Figure 7:
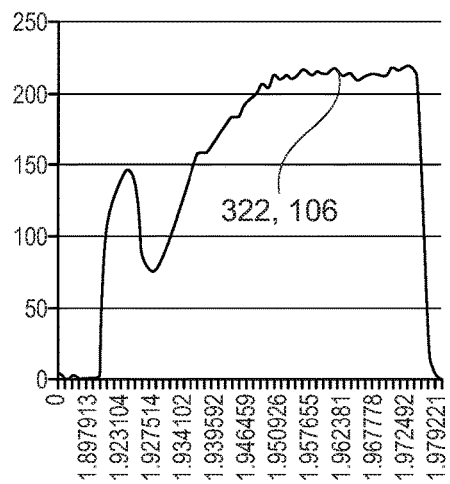
FIG. 7 through FIG. 10 each show a measurement value function of a coil current.
Figure 8:
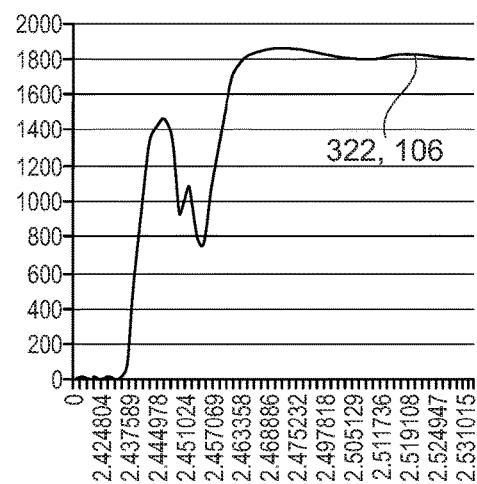
Figure 9:
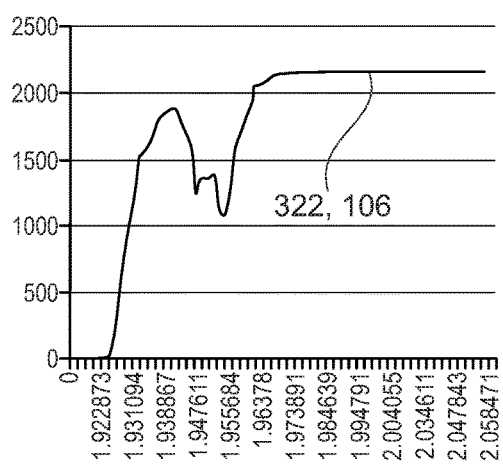
Figure 10:
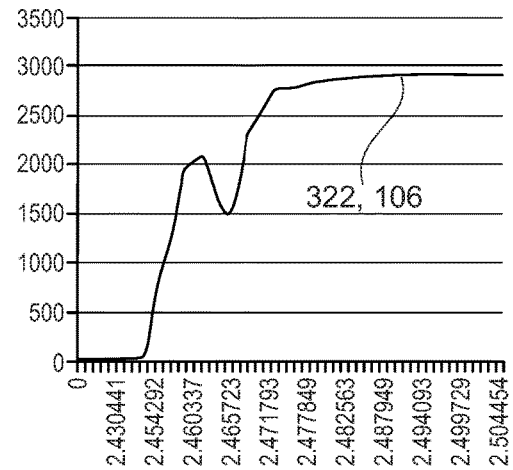

FIG. 7 through FIG. 10 each show a measurement value function 322 of a coil current 322 for various high-voltage contactors. FIG. 7 shows a coil current 322 during a switch-on cycle for a HFE18V-40 high-voltage contactor, FIG. 8 for a EVC175 high-voltage contactor, FIG. 9 for a EVC250 high-voltage contactor, and FIG. 10 for a EVC500 high-voltage contactor.

The embodiments shown herein allow the coil current 322 during the closing cycle to be monitored with relatively little effort. As the anchor moves, the coil inductivity changes since different anchor lengths are located in the area of the coil's electro-magnetic field. The motion of the anchor in the coil causes a signal collapse of the current signal. The described effects cause a significant collapse of the coil current 322 shortly after the coil is energized. This may be easily detected with little effort by means of software or a corresponding device, for instance in the form of an ASIC. In the event of a stuck contactor (even for a single-sided stuck contactor), the anchor will exhibit no or only little motion. This results in a different coil current function 322 during the switch-on cycle. The diagnosis may be performed on every closing cycle.

FIG. 11 through FIG. 18 show measurement value functions 106 for the corresponding coil voltage (U) and/or for the corresponding coil current (I) during the switching cycle of various high-voltage contactors.

The following figures are based on a test-stand setup wherein the contactor to be examined was directly energized with the power supply. The following measurements therefore did not involve the use of electronics. The coil current was recorded with a current probe.

Figure 11:
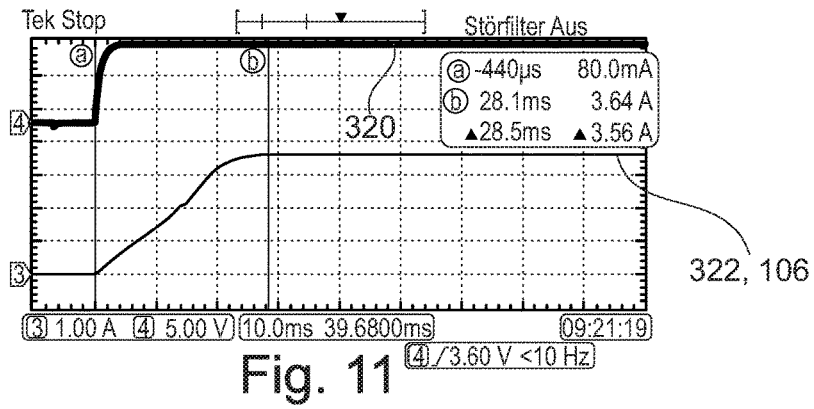
FIG. 11 through FIG. 18 show measurement value functions for the generated coil voltage (U) and/or for the corresponding coil current (I) during the switching cycle of various high-voltage contactors.
Figure 12:
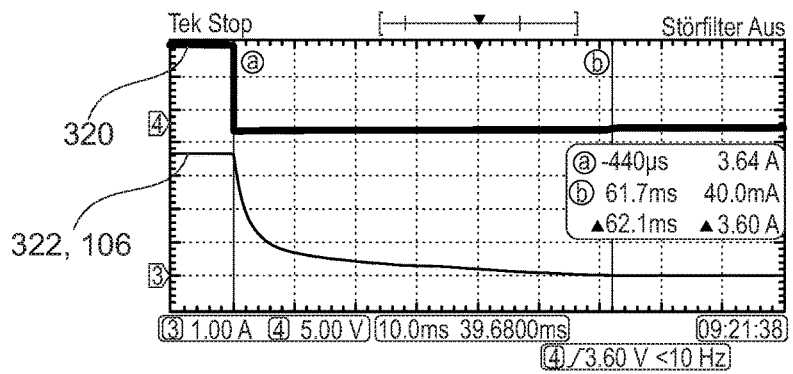

FIG. 11 shows a current function 322 for a defective EVC250 high-voltage contactor during the switch-on cycle, and FIG. 12 shows a current function 322 for the same defective high-voltage contactor during the switch-off cycle.

Figure 13:
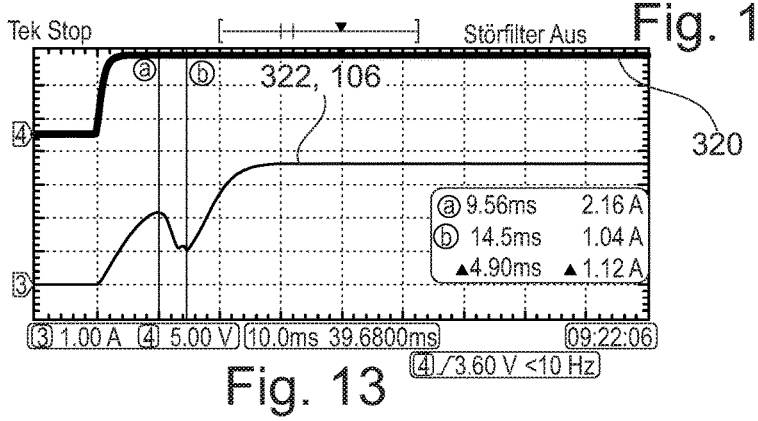
Figure 14:
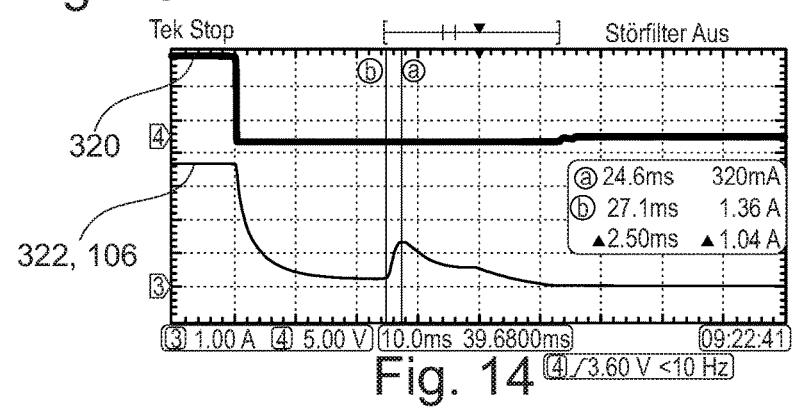

FIG. 13 shows a current function 322 for an intact EVC250 high-voltage contactor during the switch-on cycle. During the switch-on cycle, the current collapses after approximately 9.5 ms for a duration of 5 ms, before rising to the maximum value. This is the expected behavior, which may be verified by a diagnostic function. FIG. 14 shows a current function 322 of the same intact high-voltage contactor during the switch-off cycle. The coil current also rises once again during the switch-off cycle as the anchor drops back. If the electronics are developed in a manner that the coil current may also be measured during the switch-off cycle, a stuck contactor may already be directly detected during the switch-off cycle.

Depending on the circuit, the voltage across the coil may also be used for the diagnostic function during the switch-off cycle. In the extreme cases shown in FIG. 15 and FIG. 16, the wire to the contactor was subjected to a hard interruption, thus causing the coil current to instantly go to 0 A. However, an inductive voltage that is also dependent on the anchor motion is generated in this case.

Figure 15:
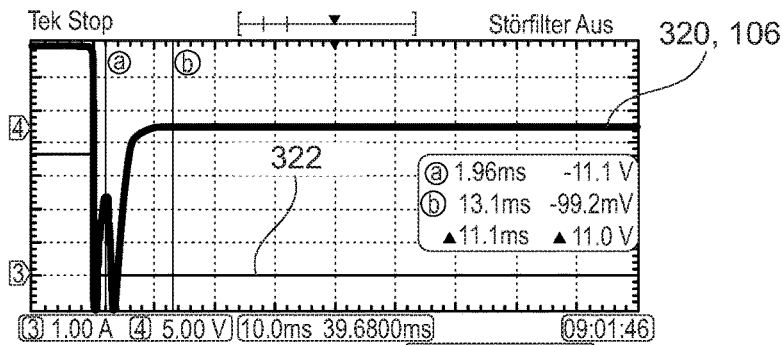
Figure 16:
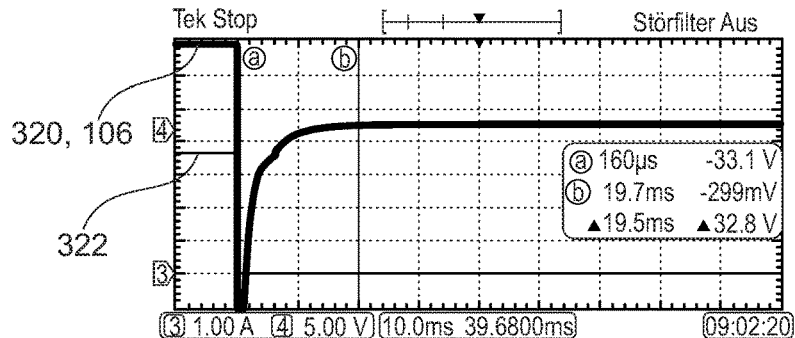

FIG. 15 and FIG. 16 show a defect-free EVC250 high-voltage contactor. FIG. 15 shows the measurement value function 106 of the coil voltage 320 during the switch-on cycle, and during the switch-off cycle in FIG. 16.

Figure 17:
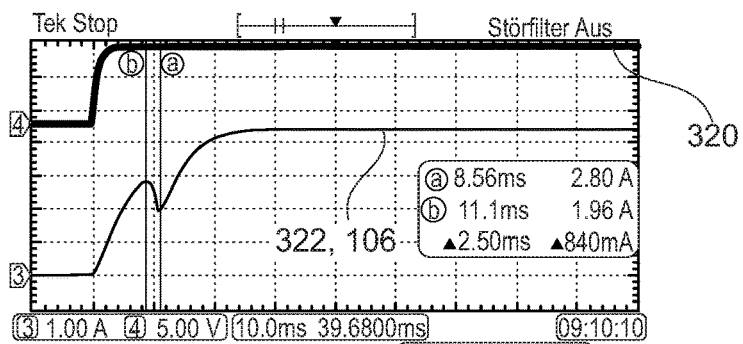
Figure 18:
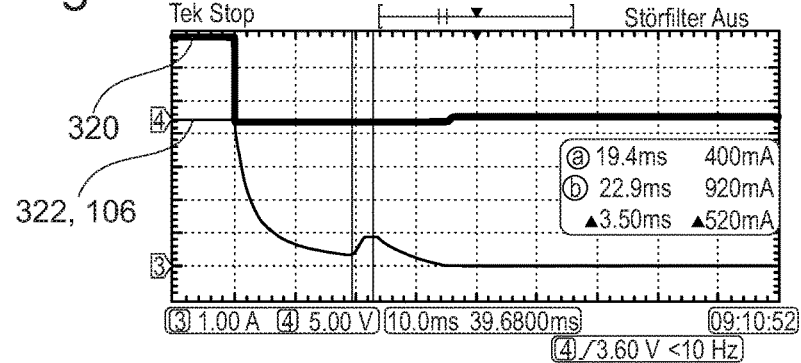

In the same manner, FIG. 17 and FIG. 18 show a defect-free high-voltage contactor of type EVC500.

LIST OF IDENTIFIERS

100 Device
102 Interface for reading in
104 Analysis device
106 Measurement value function
108 Travel distance
110 High-voltage contactor
112 Coil
114 Anchor
I Coil current
U Coil voltage
116 Comparison device
118 Threshold value
120 Fault signal
122 Measurement device
124 High-voltage on-board power system
126 Travel distance
128 First contact 130 Second contact
132 Switching element
134 Idle position
136 Switched position
140 Vehicle
200 Method
S1 Reading in step
S2 Determination step
S3 Comparison step
320 Measurement value function, voltage signal
322 Measurement value function, current signal, current function of a coil current
323 electrical state of the switching contacts
324 Flank
326 local maximum
328 local minimum
330 Signal swing, flank height
$\Delta t_1$ Time duration of the flank
$\Delta t_2$ Time duration
432 Threshold value band

What is claimed is:

1. A device for monitoring a high-voltage contactor having a coil and an anchor, wherein the coil is configured to be energized with a current or a voltage, and wherein the anchor is configured to switch the contactor by traveling between plural positions, the device comprising:
an interface configured to detect a measurement value function, reflecting a signal value of at least one of the coil current or the coil voltage with respect to time, during a switching cycle of the contactor;
an analysis device configured to determine motion information representing a distance traveled by the anchor based on a ratio of a signal spacing between a local maximum of a signal segment of the measurement value function and a local minimum of the signal segment of the detected measurement value function to a height of the signal segment, wherein the height of the signal segment represents an amplitude range of the signal segment; and
a comparison device configured to compare the motion information to a threshold and to generate a fault signal when the motion information exceeds the threshold.

2. The device of claim 1, wherein the measurement value function represents a current function of the coil current.

3. The device of claim 1, wherein the threshold comprises a percentage of a height of the signal segment, wherein the height of the signal segment represents an amplitude range of the signal segment.

4. The device of claim 3, wherein the threshold comprises at least 5% of the signal segment height.

5. The device of claim 3, wherein the threshold comprises at least 10% of the signal segment height.

6. The device of claim 1, wherein the analysis device is further configured to determine the motion information based on a time differential between the local maximum and the local minimum and a time span of the signal segment.

7. The device of claim 1, wherein the threshold comprises a value band, wherein the value band comprises an ideal measurement value function having a tolerance range.

8. A method for monitoring a high-voltage contactor having a coil and an anchor, wherein the coil is configured to be energized with a current or a voltage, and wherein the anchor is configured to switch the contactor by traveling between plural positions, the method comprising:
detecting, via an interface, a measurement value function, reflecting a signal value of at least one of the coil current or the coil voltage with respect to time, during a switching cycle of the contactor;
determining, by use of an analysis device communicating with the interface, motion information representing a distance traveled by the anchor based on a ratio of a signal spacing between a local maximum of a signal segment of the measurement value function and a local minimum of the signal segment of the detected measurement value function to a height of the signal segment, wherein the height of the signal segment represents an amplitude range of the signal segment;
comparing, by use of a comparison device, the motion information to a threshold; and generating a fault signal output from the comparison device, when the motion information exceeds the threshold, indicating an operational status of the high-voltage contactor.

9. The method of claim 8, further comprising at least one of filtering or smoothing the measurement value function before determining motion information based on the measurement value function.

10. The method of claim 8, wherein the measurement value function represents a current function of the coil current.

11. The method of claim 8, wherein the threshold comprises a percentage of a height of the signal segment, wherein the height of the signal segment represents an amplitude range of the signal segment.

12. The method of claim 11, wherein the threshold comprises at least 5% of the signal segment height.

13. The method of claim 8, wherein determining motion information further comprises determining motion information based on a time differential between the local maximum and the local minimum and a time span of the signal segment.

14. The method of claim 8, wherein the threshold comprises a value band, wherein the value bank comprises an ideal measurement value function having a tolerance range.

15. A non-transitory, computer-readable medium storing instructions for monitoring a high-voltage contactor having a coil and an anchor, wherein the coil has a current or a voltage, and the anchor is configured to switch the contactor, the instructions causing:
an interface to read a measurement value function, reflecting a signal value of at least one of the coil current or the coil voltage with respect to time, during a switching cycle of the contactor;
an analysis device to determine motion information representing a distance traveled by the anchor based on a ratio of a signal spacing between a local maximum of a signal segment of the measurement value function and a local minimum of the signal segment of the detected measurement value function to a height of the signal segment, wherein the height of the signal segment represents an amplitude range of the signal segment;
a comparison device to compare the motion information to a threshold; and
the comparison device to generate and output a fault signal, when the motion information exceeds the threshold, indicating an operational status of the high-voltage contactor.

* * * * *